(54) NON-SHRINKABLE PASSIVATION SCHEME FOR METAL EM IMPROVEMENT

(75) Inventors: So-Wein Kuo, Hsin Chu; Chu-Yun Fu, Taipei; Syun-Ming Jang; Ruey-Lian Hwang, both of Hsin-Chu, all of (TW)

(73) Assignee: Taiwan Semiconductor Manufacturing Company, Hsin-Chun (TW)

( * ) Notice: Subject to any disclaimer, the term of this patent is extended or adjusted under 35 U.S.C. 154(b) by 0 days.

(21) Appl. No.: 09/318,957

(22) Filed: May 26, 1999

(51) Int. Cl.[7] .......................... H01L 21/31; H01L 21/469
(52) U.S. Cl. .......................... 438/763; 438/623; 438/958
(58) Field of Search .................. 438/623, 634, 438/639, 763, 782, 663, 958

(56) References Cited

U.S. PATENT DOCUMENTS

| | | | |
|---|---|---|---|
| 5,681,425 | 10/1997 | Chen | 156/643.1 |
| 5,759,906 | 6/1998 | Lou | 438/623 |
| 5,851,603 | 12/1998 | Tsai et al. | 427/579 |
| 5,858,869 | 1/1999 | Chen et al. | 438/623 |
| 6,069,069 | * 5/2000 | Chooi et al. | 438/634 |
| 6,110,843 | * 8/2000 | Chien et al. | 438/782 |
| 6,114,186 | * 9/2000 | Jeng et al. | 438/623 |

* cited by examiner

*Primary Examiner*—David Nelms
*Assistant Examiner*—Phuc T. Dang
(74) *Attorney, Agent, or Firm*—George O. Saile; Stephen B. Ackerman; Rosemary L. S. Pike

(57) ABSTRACT

A new method of forming a non-shrinkable metal passivation layer that will eliminate metal voiding and improve electromigration lifetime of the integrated circuit device is described. Semiconductor device structures are provided in and on a semiconductor substrate and covered by an insulating layer. A metal layer is deposited overlying the insulating layer and patterned to form metal lines wherein there is a gap between two of the metal lines. A non-shrinkable passivation layer is formed according to the following steps: 1) a HDP-CVD oxide layer is deposited overlying the metal lines wherein the gap is filled by the HDP-CVD oxide layer. 2) A silicon nitride layer is deposited by plasma-enhanced chemical vapor deposition overlying the HDP-CVD oxide layer. Or, 1) a PECVD oxide layer is deposited over the metal lines. 2) A silicon nitride layer is deposited by PECVD over the oxide layer to fill the gap and complete the passivation. Then, the fabrication of the integrated circuit device is completed. Completion of fabrication includes thermal processing. Voids are not formed within the metal lines because the non-shrinkable passivation layer does not shrink during the thermal processing.

16 Claims, 1 Drawing Sheet

NON-SHRINKABLE PASSIVATION SCHEME FOR METAL EM IMPROVEMENT

BACKGROUND OF THE INVENTION (1) Field of the Invention

The invention relates to a method of passivation in the fabrication of integrated circuits, and more particularly, to a method of passivation which will both eliminate metal voiding and improve metal electromigration lifetime in the fabrication of integrated circuits.

(2) Description of the Prior Art

The conventional top metal passivation scheme is a sandwich layer comprising silicon oxynitride, spin-on-glass, and a top layer of silicon nitride. However, after the complete thermal cycle, a void may be found in the metal line.

For example, FIG. 1 illustrates a partially completed integrated circuit device. Top metal lines 20 are shown. Layer 16 on the semiconductor substrate contains all of the semiconductor device structures and lower level metallization, not shown in detail here. First dielectric layer 22 comprises silicon oxynitride having a thickness of about 1500 Angstroms. A spin-on-glass layer or layers 24 fills the gaps between the metal lines. The top dielectric layer 26 comprises silicon nitride deposited by plasma-enhanced chemical vapor deposition (PECVD) to a thickness of between about 7000 and 10,000 Angstroms. Scanning electron microscope (SEM) pictures show the presence of metal voids 30 when this conventional passivation scheme is used. Jmax is one index of electromigration lifetime. It is desirable to have a Jmax of at least 1.6 mA/$\mu$m. The top metal line Jmax using the conventional process is between about 0.5 and 1.0 mA/$\mu$m. The void 30 has been seen to be larger than half the size of the metal line.

The inventors have discovered that the metal voiding is a stress-induced void caused by thermal shrinkage of the spin-on-glass layer after the complete thermal cycle has been run. It has been discovered that the spin-on-glass shrinks by about 8% which induces metal voiding. It is desired to find a non-shrinkable passivation scheme to eliminate metal voiding and improve electromigration lifetime.

U.S. Patent 5,681,425 to Chen teaches gap filling by a series of deposition and etching cycles using PECVD TEOS (tetraethoxysilane) oxide and a top passivation layer of silicon nitride. U.S. Patent 5,851,603 to Tsai et al discloses a passivation layer comprising oxide/nitride/oxide/nitride. The oxide could be a high density plasma (HDP) oxide. U.S. Patent 5,759,906 to Lou discloses a multilayer passivation layer including a first PECVD TEOS oxide layer and a spin-on-glass layer wherein the sidewalls of a via through this layer are coated with a HDP fluoro-silicate glass (FSG) layer to prevent poisoned via contamination. U.S. Pat. No. 5,858,869 to Chen discloses a passivation layer comprising an anisotropic plasma oxide, a polymer, and a FSG layer deposited by HDPCVD. None of these patents mention the metal voiding problem.

SUMMARY OF THE INVENTION

A principal object of the present invention is to provide an effective and very manufacturable method of forming a metal passivation layer in the fabrication of an integrated circuit.

Another object of the present invention is to provide an effective and very manufacturable method of forming a non-shrinkable metal passivation layer in the fabrication of an integrated circuit.

Another object of the present invention is to form a non-shrinkable passivation layer over metal lines so that metal voiding is eliminated.

A further object of the invention is to form a non-shrinkable passivation layer over metal lines that will improve the electromigration lifetime of the integrated circuit device.

A still further object is to form a non-shrinkable metal passivation layer using HDP-CVD oxide and PECVD silicon nitride.

Yet another object of the invention is to form a non-shrinkable metal passivation layer using PECVD oxide and PECVD silicon nitride.

Yet another object is to form a non-shrinkable metal passivation layer that will eliminate metal voiding and improve electromigration lifetime of the integrated circuit device.

In accordance with the objects of this invention a new method of forming a non-shrinkable metal passivation layer that will eliminate metal voiding and improve electromigration lifetime of the integrated circuit device is achieved. Semiconductor device structures are provided in and on a semiconductor substrate and covered by an insulating layer. A metal layer is deposited overlying the insulating layer and patterned to form metal lines wherein there is a gap between two of the metal lines. A non-shrinkable passivation layer is formed according to the following steps: a HDP-CVD oxide or PECVD oxide layer is deposited overlying the metal lines wherein the gap is filled by the HDP-CVD oxide or PECVD oxide layer. A silicon nitride layer is deposited by plasma-enhanced chemical vapor deposition overlying the HDP-CVD oxide layer. The fabrication of the integrated circuit device is completed. Completion of fabrication includes thermal processing. Voids are not formed within the metal lines because the non-shrinkable passivation layer does not shrink during the thermal processing.

BRIEF DESCRIPTION OF THE DRAWINGS

In the accompanying drawings forming a material part of this description, there is shown.

DESCRIPTION OF THE PREFERRED EMBODIMENTS

The present invention provides a non-shrinkable passivation scheme which can eliminate metal voiding and can improve the electromigration lifetime of the integrated circuit device. The inventors have discovered that metal voiding is caused by stress-induced shrinkage of the spin-on-glass layer after the full thermal cycle has been run. We can reduce metal voiding by decreasing the metal sidewall stress caused by the passivation thermal cycle. Two low stress passivation schemes are disclosed herein.

Figure 1:
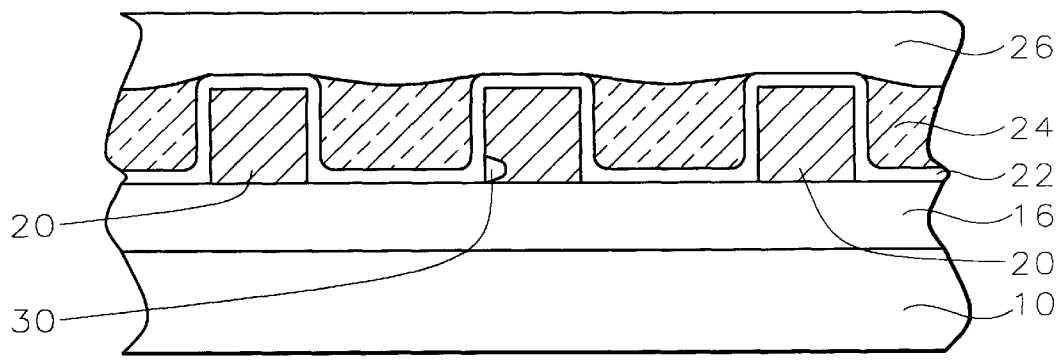
FIG. 1 schematically illustrates in cross-sectional representation an embodiment of the prior art.
Figure 2:
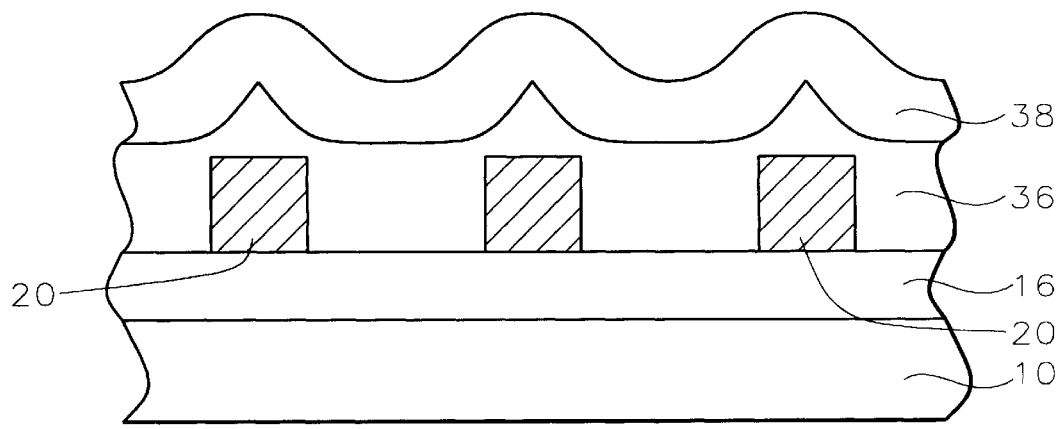
FIG. 2 schematically illustrates in cross-sectional representation a first preferred embodiment of the present invention.

Referring now more particularly to FIG. 2, the first preferred embodiment of the present invention will be disclosed. There is illustrated a portion of a partially completed integrated circuit. There is shown a semiconductor substrate 10, preferably composed of monocrystalline silicon. For simplicity, semiconductor device structures such as gate electrodes and source and drain regions and lower levels of metallization with interconnections are not shown, but are encompassed within layer 16.

A top layer of metal is deposited and patterned to form metal lines, as shown in FIG. 2. Typically, the metal lines 20 will comprise a first layer of titanium nitride having a thickness of between about 250 and 500 Angstroms, a second layer of aluminum or an aluminum alloy such as AlCu having a thickness of between about 8000 and 9000 Angstroms, and a top layer of titanium nitride having a thickness of between about 250 and 700 Angstroms.

The novel passivation scheme of the present invention comprises a first layer of high density plasma chemically vapor deposited HDP-CVD oxide 36 deposited over the metal lines to a thickness of between about 10,000 and 12,000 Angstroms and filling the gaps between the metal lines, as shown. Because of the characteristics of the HDP-CVD deposition, the oxide completely fills the gaps between the metal lines and deposits in a dome or triangle formation over the metal lines.

Next, a layer of silicon nitride 38 is deposited by PECVD over the HDP-CVD oxide 36 to a thickness of between about 7000 and 8000 Angstroms. The resulting passivation layer 36/38 does not shrink after completion of the thermal cycle. SEM pictures show the absence of metal voiding when the non-shrinkable passivation scheme of the present invention is used. The Jmax of this passivation layer is more than 4 mA/$\mu$m, which is well above the desired 1.6 mA/$\mu$m. This means that the electromigration lifetime is completely satisfactory.

Figure 3:
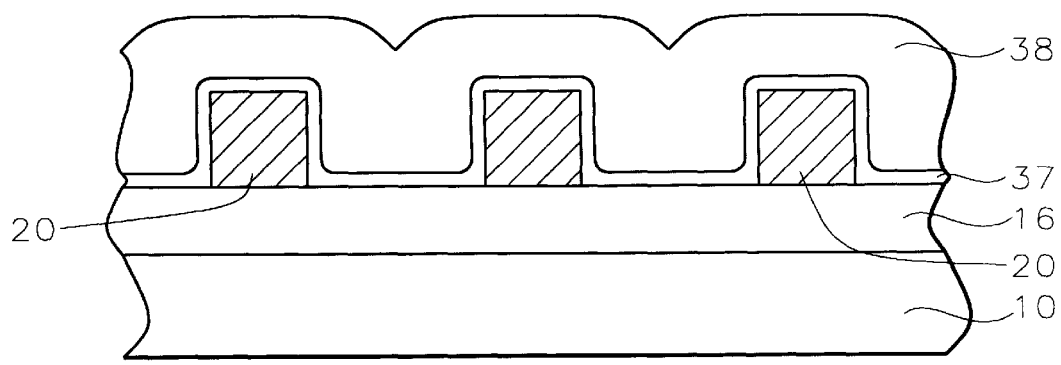
FIG. 3 schematically illustrates in cross-sectional representation a second preferred embodiment of the present invention.

Referring now more particularly to FIG. 3, the second preferred embodiment of the present invention will be disclosed. There is illustrated a portion of a partially completed integrated circuit. There is shown a semiconductor substrate 10, preferably composed of monocrystalline silicon. For simplicity, semiconductor device structures such as gate electrodes and source and drain regions and lower levels of metallization with interconnections are not shown, but are encompassed within layer 16.

A top layer of metal is deposited and patterned to form metal lines, as shown in FIG. 3. Again, typically, the metal lines 20 will comprises a first layer of titanium nitride having a thickness of between about 250 and 500 Angstroms, a second layer of aluminum or an aluminum alloy such as AlCu having a thickness of between about 8000 and 9000 Angstroms, and a top layer of titanium nitride having a thickness of between about 250 and 700 Angstroms.

The second novel passivation scheme of the present invention comprises a first layer of silicon oxide 37 conformally deposited by plasma-enhanced chemical vapor deposition (PECVD) over the metal lines to a thickness of between about 2000 and 3000 Angstroms.

Next, a layer of silicon nitride 38 is deposited by PECVD over the PE-oxide 37 to a thickness of between about 7000 and 8000 Angstroms, filling the gaps between the metal lines.

The resulting passivation layer 37/38 does not shrink after completion of the thermal cycle. SEM pictures show the absence of metal voiding when the non-shrinkable passivation scheme of the present invention is used. The Jmax of this passivation layer is also more than 4 mA/$\mu$m.

The process of the present invention has been implemented. SEM results show metal voiding does not occur when the non-shrinkable passivation scheme of the present invention is used. Electromigration lifetimes are improved, as indicated by the Jmax measurements. Both passivation embodiments—HDP-CVD oxide/PECVD silicon nitride and PECVD oxide/PECVD silicon nitride—provide passivation with an absence of voids and with improved electromigration lifetimes. The HDP-CVD scheme is preferred because it can also prevent passivation bubbling.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing semiconductor device structures in and on a semiconductor substrate wherein said semiconductor device structures are covered by an insulating layer;

depositing and patterning a metal layer overlying said insulating layer to form metal lines wherein there is a gap between two of said metal lines;

depositing a HDP-CVD oxide layer overlying said metal lines wherein said gap is filled by said HDP-CVD oxide layer;

depositing a silicon nitride layer overlying said HDP-CVD oxide layer; and completing said fabrication of said integrated circuit device wherein said step of completing said fabrication of said integrated circuit device includes thermal processing and wherein said HDP-CVD oxide layer does not shrink as a result of said thermal processing.

2. The method according to claim 1 wherein said semiconductor device structures include gate electrodes and associated source and drain regions and multiple layers of metal lines and intermetal dielectric.

3. The method according to claim 1 wherein said HDP-CVD oxide layer is deposited to a thickness of between about 10,000 and 12,000 Angstroms.

4. The method according to claim 1 wherein said silicon nitride layer is deposited by plasma-enhanced chemical vapor deposition to a thickness of between about 7000 and 8000 Angstroms.

5. A method of forming a non-shrinkable passivation layer in the fabrication of an integrated circuit device comprising:

providing semiconductor device structures in and on a semiconductor substrate wherein said semiconductor device structures are covered by an insulating layer;

depositing and patterning a metal layer overlying said insulating layer to form metal lines wherein there is a gap between two of said metal lines;

forming said non-shrinkable passivation layer according to the following steps:

depositing a HDP-CVD oxide layer overlying said metal lines wherein said gap is filled by said HDP-CVD oxide layer; and depositing a silicon nitride layer overlying said HDP-CVD oxide layer; and completing said fabrication of said integrated circuit device wherein said step of completing said fabrication of said integrated circuit device includes thermal processing and wherein voids are not formed within said metal lines because said non-shrinkable passivation layer does not shrink during said thermal processing.

6. The method according to claim 5 wherein said semiconductor device structures include gate electrodes and associated source and drain regions and multiple layers of metal lines and intermetal dielectric.

7. The method according to claim 5 wherein said HDP-CVD oxide layer is deposited to a thickness of between about 10,000 and 12,000 Angstroms.

8. The method according to claim 5 wherein said silicon nitride layer is deposited by plasma-enhanced chemical vapor deposition to a thickness of between about 7000 and 8000 Angstroms.

9. A method of forming a non-shrinkable passivation layer in the fabrication of an integrated circuit device comprising:

provproviding semiconductor device structures in and on a semiconductor substrate wherein said semiconductor device structures are covered by an insulating layer;

depositing and patterning a metal layer overlying said insulating layer to form metal lines wherein there is a gap between two of said metal lines;

forming said non-shrinkable passivation layer according to the following steps:
depositing an oxide layer by plasma-enhanced chemical vapor deposition overlying said metal lines; and
depositing a silicon nitride layer overlying said oxide layer wherein said gap is filled by said silicon nitride layer; and completing said fabrication of said integrated circuit device wherein said step of completing said fabrication of said integrated circuit device includes thermal processing and wherein voids are not formed within said metal lines because said non-shrinkable Passivation layer does not shrink during said thermal processing.

10. The method according to claim 9 wherein said semiconductor device structures include gate electrodes and associated source and drain regions and multiple layers of metal lines and intermetal dielectric.

11. The method according to claim 9 wherein said oxide layer is deposited to a thickness of between about 2000 and 3000 Angstroms.

12. The method according to claim 9 wherein said silicon nitride layer is deposited by plasma-enhanced chemical vapor deposition to a thickness of between about 7000 and 8000 Angstroms.

13. A method of forming a non-shrinkable passivation layer in the fabrication of an integrated circuit device comprising:

providing semiconductor device structures in and on a semiconductor substrate wherein said semiconductor device structures include gate electrodes and associated source and drain regions and multiple layers of metal lines and intermetal dielectric and wherein said semiconductor device structures are covered by an insulating layer;

depositing and patterning a metal layer overlying said insulating layer to form metal lines wherein there is a gap between two of said metal lines;

depositing said non-shrinkable passivation layer overlying said metal lines;

depositing a silicon nitride layer overlying said non-shrinkable passivation layer wherein said gap is filled by a combination of said non-shrinkable passivation layer and said silicon nitride layer; and completing said fabrication of said integrated circuit device wherein said step of completing said fabrication of said integrated circuit device includes thermal processing and wherein voids are not formed within said metal lines because said non-shrinkable passivation layer does not shrink during said thermal processing.

14. The method according to claim 13 wherein said non-shrinkable passivation layer comprises HDP-CVD oxide deposited to a thickness of between about 10,000 and 12,000 Angstroms.

15. The method according to claim 13 wherein said non-shrinkable passivation layer comprises silicon oxide layer deposited by plasma-enhanced chemical vapor deposition to a thickness of between about 2000 and 3000 Angstroms.

16. The method according to claim 13 wherein said silicon nitride layer is deposited by plasma-enhanced chemical vapor deposition to a thickness of between about 7000 and 8000 Angstroms.

* * * * *